(12) United States Patent
Izumiyama

(10) Patent No.: US 6,339,702 B1
(45) Date of Patent: Jan. 15, 2002

(54) OUTPUT POWER DETECTION CIRCUIT OF TRANSMITTER

(75) Inventor: Toru Izumiyama, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/241,601

(22) Filed: Feb. 1, 1999

(30) Foreign Application Priority Data

Feb. 2, 1998 (JP) .................................. 10-020915

(51) Int. Cl.[7] ................................................ H03C 1/62
(52) U.S. Cl. .................... 455/115; 455/550; 455/63; 455/67.1; 324/647; 330/110
(58) Field of Search ................. 455/115, 127, 455/126, 67.1, 63; 324/647, 648; 330/110, 181–184

(56) References Cited

U.S. PATENT DOCUMENTS

| | | | | |
|---|---|---|---|---|
| 3,577,139 A | * | 5/1971 | Foerster | 341/162 |
| 4,637,003 A | * | 1/1987 | Yokogawa | 369/32 |
| 4,841,177 A | * | 6/1989 | Sugiyama et al. | 327/567 |
| 5,589,682 A | * | 12/1996 | Brown et al. | 250/214 A |
| 5,659,253 A | * | 8/1997 | Busking | 324/648 |
| 5,742,201 A | * | 4/1998 | Eisenberg et al. | 330/2 |
| 5,801,552 A | * | 9/1998 | Moore | 327/62 |
| 5,898,337 A | * | 4/1999 | Inahasi | 330/134 |

FOREIGN PATENT DOCUMENTS

| | | |
|---|---|---|
| JP | Hei 8-148952 | 6/1996 |
| JP | Hei 9-55668 | 2/1997 |

* cited by examiner

Primary Examiner—Dwayne Bost
Assistant Examiner—Charles Craver
(74) Attorney, Agent, or Firm—Brinks Hofer Gilson & Lione

(57) ABSTRACT

An output power detection circuit of a transmitter, which can accurately detect a power outputted from a power amplifier without depending on a change in ambient temperature is realized. The circuit comprises: a first diode to which a first bias direct current is applied; first load resistors through which the first bias direct current flows; a second diode to which a second bias direct current is applied; second load resistors through which the second bias direct current flows; and a differential amplifier. A first voltage generated in the first load resistor and a second voltage generated in the second load resistor are made substantially the same and are applied to the differential amplifier, a detection voltage obtained by detecting operation of the first diode is added to the first voltage, and a voltage corresponding to the power generated from a power amplifier is detected.

3 Claims, 1 Drawing Sheet

OUTPUT POWER DETECTION CIRCUIT OF TRANSMITTER

BACKGROUND OF THE INVENTION

1. Field of the Invention

The present invention relates to an output power detection circuit of a transmitter and, more particularly, to an output power detection circuit having no temperature dependency.

2. Description of the Related Art

An output power detection circuit of a conventional transmitter will be described with reference to FIG. 2. A transmission signal is amplified by a driver amplifier 31 and is further amplified by a power amplifier 32 to a predetermined output power, and the resultant signal is supplied to an isolator 33. The signal is transmitted from an antenna (not shown) via an antenna sharing device (not shown).

A part of the transmission signal from the power amplifier 32 is supplied to an output power detection circuit (hereinafter, called a detection circuit) 34 where a voltage (detection voltage) proportional to the output power is detected.

The detection voltage is amplified by a dc amplifier 35 and is converted into a digital signal by an A/D converter 36. The digital signal is inputted to a not-illustrated control circuit, properlyprocessed, and outputted as a control signal. The control signal controls the amplification degree of the driver amplifier 31 to make the output power from the power amplifier 32 constant.

The detection circuit 34 has two detection diodes 42 and 43 to which a bias current in the forward direction is applied by a voltage from a power source terminal 41. The cathode of the detection diode 42 and the anode of the other detection diode 43 are connected, so that the two detection diodes 42 and 43 are connected in series. The cathode of the detection diode 43 is connected to the ground via voltage dividing resistors 44 and 45 which are connected in series.

A part of the transmission signal from the power amplifier 32 is supplied to a connection point between the cathode of the detection diode 42 and the anode of the detection diode 43 via a coupling capacitor 46 and a series resistor 47. The anode of the detection diode 42 is connected to the ground via a direct current blocking capacitor 48 and the cathode of the detection diode 43 is connected to the ground via a smoothing capacitor 49.

In the above construction, when a part of the transmission signal from the power amplifier 32 is supplied to the detection circuit 34, it is rectified by the two detection diodes 42 and 43 and a detection voltage proportional to the output power is obtained from the connection point between the voltage dividing resistors 44 and 45.

In the above construction, since the static characteristics of the detection diodes 42 and 43 have temperature dependency, when the temperature around the detection diodes 42 and 43 changes, the detection voltage is changed accordingly. Consequently, there is a problem that an accurate output electric power cannot be detected.

That is, for instance, when the ambient temperature rises, the static characteristic of the detection diodes 42 and 43 changes in such a manner that the forward current increases, thereby increasing the bias current. As a result, the detection voltage appearing at the connection point of the voltage dividing resistors 44 and 45 also increases. The detection voltage increases by the increase in the bias current flowing in the detection diodes 42 and 43, so it is not the output power which is accurately detected. For example, when the amplification degree of the driver amplifier 31 is controlled on the basis of the detection voltage, a predetermined output power cannot be therefore obtained.

SUMMARY OF THE INVENTION

It is therefore an object of the invention to provide an output power detection circuit of a transmitter, which can accurately detect an output power from a power amplifier without depending on a change in ambient temperature.

In order to realize the object, an output power detection circuit of a transmitter of the invention comprises: a first diode to which a first load resistor is connected in series and through which a first bias direct current flows; a second diode to which a second load resistor is connected in series and through which a second bias direct current flows; and a differential amplifier in which a first voltage generated in the first load resistor is applied to one of input terminals and a second voltage generated in the second load resistor is applied to the other input terminal. It is set so that the first voltage generated in the first load resistor by the first bias direct current and the second voltage generated in the second load resistor by the second bias direct current are made equal. By adding a part of a transmission signal outputted from the power amplifier to the first diode, a voltage according to the power of the transmission signal is detected from the differential amplifier.

According to an output power detection circuit of a transmitter of the invention, the first and second diodes have static characteristics which are the same, the first and second load resistors are set to have resistance values which are equal, and the first and second bias direct currents are applied from the same power source.

According to an output power detection circuit of a transmitter of the invention, at least one of the first and second load resistors is constructed by including a variable resistor.

According to an output power detection circuit of a transmitter of the invention, each of the first and second diodes has two diodes which are connected in series, a transmission signal from the power amplifier is inputted to the connection point of the two diodes which construct the first diode, and the transmission signal is rectified to a double voltage by the two diodes constructing the first diode.

DETAILED DESCRIPTION OF PREFERRED EMBODIMENT

Figure 1:
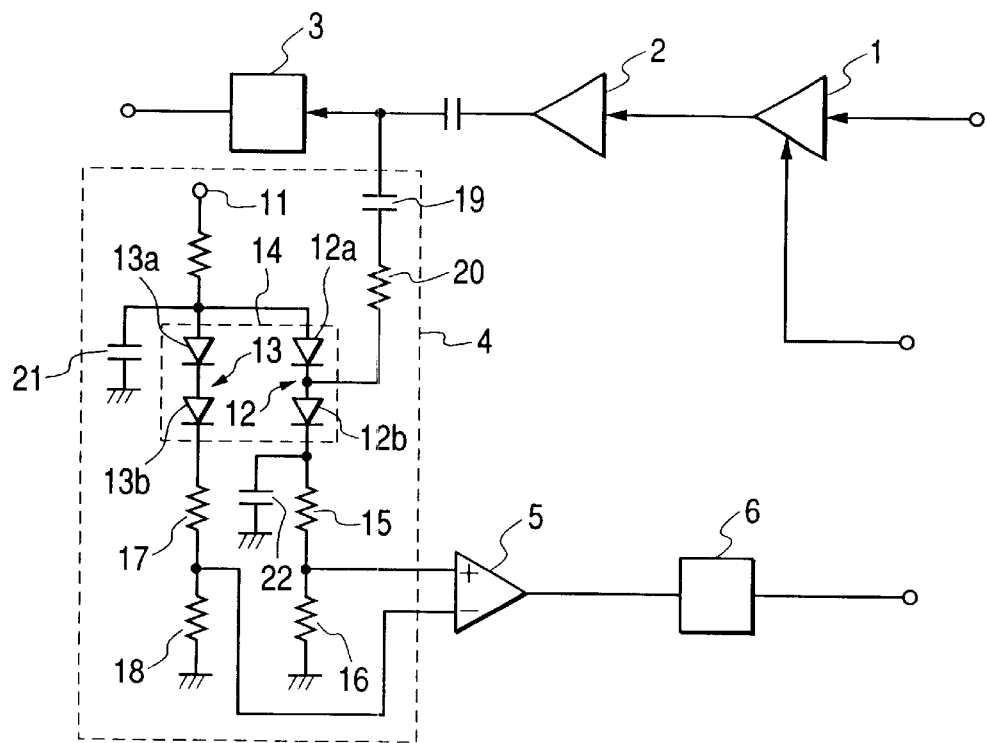
FIG. 1 is a circuit diagram for explaining a transmission power detection circuit of a transmitter of the present invention.
Figure 2:
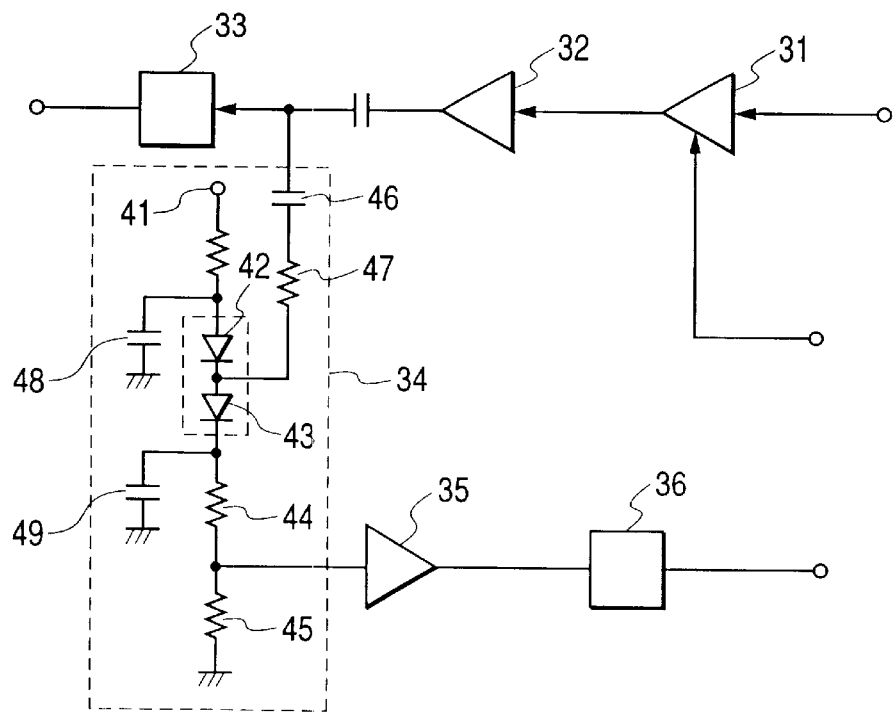
FIG. 2 is a circuit diagram for explaining a transmission power detection circuit of a conventional transmitter.

An output power detection circuit of a transmitter of the invention will be described with reference to FIG. 1. A transmission signal is amplified by a driver amplifier 1 and is further amplified by a power amplifier 2 to a predetermined output power, and the resultant signal is supplied to an isolator 3. A signal from the isolator 3 is transmitted from an antenna (not shown) via an antenna sharing device.

A part of the transmission signal from the power amplifier 2 is supplied to an output power detection circuit 4 (hereinafter, called a detection circuit) where a voltage (detection voltage) proportional to the output power is detected.

The detection voltage is amplified by a differential amplifier 5 and, after that, converted into a digital signal by an A/D converter 6. The digital signal is supplied to a control circuit (not shown), properly processed, and outputted as a control signal which controls the amplification degree of the driver amplifier 1 to make the output power from the power amplifier 2 constant.

The detection circuit 4 has two diode means 12 and 13 to which a forward bias current is applied by a voltage from a voltage terminal 11. The diode means 12 and 13 have almost the same static characteristic and are housed in the same package 14.

One diode means (first diode) 12 is used for detecting a signal transmitted from the power amplifier 2 and is constructed by two diodes 12a and 12b having almost the same static characteristic. The anode of the diode 12b is connected to the cathode of the diode 12a. Two resistors 15 and 16 serving as a first load resistor are connected in series between the cathode of the diode 12b and the ground so that a first bias direct current flows through the first diode 12 and the resistors 15 and 16. In this manner, the detection efficiency by the first diode 12 is increased.

On the other hand, the other diode means (second diode) 13 is also constructed by two diodes 13a and 13b having almost the same static characteristic and the anode of the diode 13b is connected to the cathode of the diode 13a. Two resistors 17 and 18 serving as a second load resistor are connected in series between the cathode of the diode 13b and the ground, so that a second bias direct current flows through the second diode 13 and the resistors 17 and 18.

The total of resistance values of the resistors 15 and 16 provided between the cathode of the diode 12b and the ground and that of resistance values of the resistors 17 and 18 provided between the cathode of the diode 13b and the ground are almost equal. Consequently, the first bias direct current flowing through the first diode 12 and the second bias direct current flowing through the second diode 13 are set to be almost equal. A first voltage is taken from the connection point between the resistors 15 and 16 and a second voltage is taken from the connection point between the resistors 17 and 18. By setting the resistance values of the resistors 16 and 18 provided on the ground side to be almost the same, the first and second voltages can be easily made almost equal. When one of the resistors, for example, the resistor 18 serves as a variable resistor, by finely adjusting the resistance value of the resistor 18, the first and second voltages can be made equal accurately.

The connection point between the resistors 15 and 16 is connected to the non-inverting input terminal of the differential amplifier 5 and the connection point between the resistors 17 and 18 is connected to the inverting input terminal of the differential amplifier 5.

In the above construction, a part of the transmission signal from the power amplifier 2 is supplied to the connection point between the cathode of the diode 12a and the anode of the diode 12b via a coupling capacitor 19 and a series resistor 20. The anode of the diode 12a is connected to the ground via a d.c. blocking capacitor 21 and the cathode of the detection diode 12b is connected to the ground via a smoothing capacitor 22. The transmission signal is rectified to a double voltage by the detection diodes 12a and 12b, and the rectified voltage (detection voltage) is divided by the resistors 15 and 16 and is added to the first voltage.

A voltage obtained by adding the detection voltage to the first voltage is inputted to the non-inverting input terminal of the differential amplifier 5 and the second voltage is inputted to the inverting input terminal of the differential amplifier 5. Since the first and second voltages are equal, the first and second voltages are offset in the differential amplifier 5 and only the detection voltage added to the first voltage is amplified. A voltage corresponding to the transmission power from the power amplifier 2 can be therefore detected from the differential amplifier 5.

In the transmission power detection circuit of the transmitter of the present invention, even when the static characteristic of the first diode 12 is changed by the ambient temperature and the first voltage applied to the differential amplifier 5 is changed, the static characteristic of the second diode 13 is similarly changed by the ambient temperature, the second voltage is changed, and the first and second voltages are offset in the differential amplifier 5.

Further, since the static characteristic of the first diode 12 and that of the second diode 13 are almost the same, the changes in the static characteristics by the ambient temperature become substantially the same and the changes in the first and second voltages are therefore almost the same.

By housing the first diode 12 and the second diode 13 in the same package, the first diode 12 and the second diode 13 are placed in the same ambient temperature environment, so that there is no difference between the changes in the static characteristics. Consequently, the change in the first voltage and that in the second voltage can coincide with each other accurately.

The transmission signal is detected by using the two diodes 12a and 12b for the first diode 12 and, correspondingly, the two diodes 13a and 13b are used for the second diode 13. The detection efficiency by the first diode 12 is increased and the change in the first voltage and the change in the second voltage due to the change in the ambient temperature can be made the same.

As mentioned above, the output power detection circuit of the transmitter of the present invention comprises the first diode to which the first bias direct current is supplied, the first load resistor through which the first bias direct current flows, the second diode to which the second bias direct current is applied, the second load resistor through which the second bias direct current flows, and the differential amplifier. The first voltage generated in the first load resistor and the second voltage generated in the second load resistor are made substantially the same. The first and second voltages are applied to the differential amplifier, the detection voltage detected by the first diode is added to the first voltage and the voltage corresponding to the output power of the power amplifier is detected from the differential amplifier. Consequently, even when the static characteristic of the first diode is changed by the ambient temperature and the first voltage applied to the differential amplifier is changed, the static characteristic of the second diode is similarly changed by the ambient temperature, the second voltage is changed, and the first and second voltages are offset in the differential amplifier. Only the detection voltage added to the first voltage is therefore amplified and only the voltage corresponding to the transmission power from the power amplifier can be detected.

According to the output power detection circuit of the transmitter of the present invention, since the static characteristic of the first diode and that of the second diode are made substantially the same, the changes in the static characteristics by the ambient temperature become almost the same, so that the changes in the first and second voltages become substantially the same.

According to the output power detection circuit of the transmitter of the present invention, since the first and second load resistors are set to have almost the same resistance, the first and second bias direct currents are set to be substantially equal. Since the resistance value of the resistor provided on the ground side of the first load resistor and the resistance value of the resistor provided on the ground side of the second load resistor are equal, the first and second voltages can be made substantially the same.

In the output power detection circuit of the transmitter of the present invention, at least one of the first and second load resistors is constructed by including a variable resistor and the resistance value of the variable resistor is finely adjusted, thereby enabling the first and second voltages to be accurately made equal.

According to the output power detection circuit of the transmitter of the present invention, the first diode is constructed by two diodes which are connected in series, the transmission signal from the power amplifier is supplied to the connection point of the two diodes, and the transmission signal is rectified to a double voltage by the two diodes and detected. The second diode is constructed by two diodes which are connected in series. Therefore, the detection efficiency by the first diode 12 is increased and the change in the first voltage and that in the second voltage due to the change in the ambient temperature can be made the same.

What is claimed is:

1. An output power detection circuit of a transmitter, comprising:

a first diode to which a first load resistor is connected in series and through which a first bias direct current flows;

a second diode to which a second load resistor is connected in series and through which a second bias direct current flows; and a differential amplifier in which a first voltage generated in said first load resistor is applied to one of input terminals and a second voltage generated in said second load resistor is applied to the other input terminal, wherein the first voltage generated in the first load resistor by the first bias direct current and the second voltage generated in the second load resistor by the second bias direct current are substantially equal, a voltage dependent on a power of a transmission signal is detected from said differential amplifier when a part of the transmission signal outputted from a power amplifier is outputted to the first diode, and each of the first and second diodes includes a pair of series connected diodes, the transmission signal from the power amplifier is inputted to a connection point between the pair of series connected diodes of the first diode, and the transmission signal is rectified to a double voltage by the pair of series connected diodes of the first diode.

2. A circuit according to claim 1, wherein said first and second diodes have static characteristics which are the same, said first and second load resistors are set to have resistance values which are equal, and said first and second bias direct currents are applied from the same power source.

3. A circuit according to claim 2, wherein at least one of said first and second load resistors is constructed by including a variable resistor.

* * * * *